United States Patent
Nakamura

(10) Patent No.: US 8,990,624 B2
(45) Date of Patent: Mar. 24, 2015

(54) EMULATOR VERIFICATION SYSTEM, EMULATOR VERIFICATION METHOD

(75) Inventor: Shin Nakamura, Tokyo (JP)

(73) Assignee: NEC Corporation, Tokyo (JP)

(*) Notice: Subject to any disclaimer, the term of this patent is extended or adjusted under 35 U.S.C. 154(b) by 253 days.

(21) Appl. No.: 13/809,947

(22) PCT Filed: Jul. 1, 2011

(86) PCT No.: PCT/JP2011/065173
§ 371 (c)(1),
(2), (4) Date: Jan. 14, 2013

(87) PCT Pub. No.: WO2012/008319
PCT Pub. Date: Jan. 19, 2012

(65) Prior Publication Data
US 2013/0117610 A1    May 9, 2013

(30) Foreign Application Priority Data

Jul. 13, 2010  (JP) ................. 2010-158991

(51) Int. Cl.
*G06F 11/00* (2006.01)
*G06F 11/26* (2006.01)
*G01R 31/3183* (2006.01)

(52) U.S. Cl.
CPC ............ *G06F 11/006* (2013.01); *G06F 11/261* (2013.01); *G01R 31/318357* (2013.01)
USPC ......................................................... 714/32

(58) Field of Classification Search
USPC ........................................................ 714/32
See application file for complete search history.

(56) References Cited

U.S. PATENT DOCUMENTS

2009/0049417 A1    2/2009  Kinoshita et al.

FOREIGN PATENT DOCUMENTS

| JP | H04122309 A | 11/1992 |
| JP | H05181928 A | 7/1993 |
| JP | 2005301370 A | 10/2005 |
| JP | 2005346517 A | 12/2005 |
| JP | H04169875 A | 11/2006 |
| JP | 200948367 A | 3/2009 |

OTHER PUBLICATIONS

The international search report for PCT/JP2011/065173 mailed on.

*Primary Examiner* — Jigar Patel
(74) *Attorney, Agent, or Firm* — Sughrue Mion, PLLC

(57) ABSTRACT

In order to rapidly perform verification processing on the basis of test patterns in a circuit to be verified, an emulator verification system comprises: an emulator verification device that verifies the normality of content to be executed on the basis of verification test information in a circuit to be verified; a moveable test pattern storage device that is connected to the emulator verification device in an attachable/detachable manner, and that inputs test information for verification processing having a larger volume than a preset data volume into the emulator verification device; and a moveable result pattern storage device that connects to the emulator verification device in an attachable/detachable manner, and that acquires and stores verification results information having a larger volume than a fixed data volume, which shows the results of the verification processing in the emulator verification device.

8 Claims, 8 Drawing Sheets

EMULATOR VERIFICATION SYSTEM, EMULATOR VERIFICATION METHOD

This application is a National Stage Entry of PCT/JP2011/065173 filed Jul. 1, 2011, which claims priority from Japanese Patent Application 2010-158991 filed Jul. 13, 2010, the contents of all of which are incorporated herein by reference, in their entirety.

TECHNICAL FIELD

The present invention relates to an emulator verification system which performs execution processing regarding a logic circuit based on a test pattern to verify the operation state of the logic circuit.

BACKGROUND ART

With hardware emulation such as FPGA (Field Programmable Gate Array) constituted with a hardware device based on a verification-target electric circuit, it is possible to simulate actions of the verification-target circuit when a test pattern (test signal) is inputted to the circuit.

With an emulator circuit verification system using the hardware emulation, normally, a processing result of hardware emulation for an inputted test pattern (test signal) is acquired as an emulation output result, and it is compared with a preset expected value to perform the emulation verification (verification processing) which compares/judges whether or not the processing content of the designed circuit (emulator circuit) is equivalent to a prescribed processing content.

In general, as shown in FIG. 4, the emulator circuit verification system is constituted by including: an emulator verification device 200 including a circuit-to-be-verified 201 as an emulator circuit; and a server calculator 303 provided by being connected to the emulator verification device 200, which inputs a test pattern to the emulation verification device 200.

Note here that the emulator verification device 200 has the structure which includes: a data input module 304 which acquires the test pattern sent from the server calculator 303; a test pattern storage module 301 which temporarily stores and saves the test pattern; a result pattern storage module 302 which acquires and saves the processing result of the verification processing of the circuit-to-be-verified 201; and a data output module 305 which informs the processing result (verification result) of the verification processing of the circuit-to-be-verified 201 to the server calculator 303.

The emulator circuit verification system may also be set to transfer the verification result of the circuit-to-be-verified 201 to other calculators set and connected to an observation device such as a logic analyzer set in advance on the outside, for example.

As a related technique thereof, there is disclosed a system which inputs a test pattern for verification to a computer (verification device) which includes an emulator circuit that utilizes a hardware device, and takes out the processing content of the test pattern in the emulator circuit as a verification result (Patent Document 1).

Further, as a related technique thereof, there is disclosed an emulator verification device which has a verification-target logic circuit (FPGA) of the verification target and includes a control programmable device, a connecting mechanism provided to a verification device main unit, and a DUT loading module constituted with a DUT loading board (Patent Document 2).

Furthermore, as a related technique thereof, there is disclosed a system which stores information corresponding to a verification result of an emulator circuit to a memory device (IC card) that is provided in a detachable manner (Patent Document 3).

Moreover, as a related technique thereof, there is disclosed a system which makes it possible to perform another work with a verification device during a writing work of a verification result, through setting a saving place of the verification result on an IC memory card (Patent Document 4).

Patent Document 1: Japanese Unexamined Patent Publication 2005-301370
Patent Document 2: Japanese Unexamined Patent Publication 2005-346517
Patent Document 3: Japanese Unexamined Utility Model Publication Hei 04-122309
Patent Document 4: Japanese Unexamined Patent Publication Hei 04-169875

However, with the related techniques 1 and 2 described above, it takes a great amount of time for performing input processing of a test pattern to the circuit-to-be-verified and output processing of the processing result when a large-volume test pattern such as image data that is of larger file size than that of character data, for example, is used. Further, there is a possibility of having such an inconvenience that other processing cannot be used in the emulator verification device at the time of input/output of the test pattern.

Further, when it becomes necessary to restart the verification processing in the circuit-to-be-verified 201 or to re-input the test pattern, for example, e.g., in a case where there is a circuit change regarding the circuits-to-be-verified set in advance, a case where the power of the emulator verification device 200 is turned off (in an off state), a great amount of effort and time are required for execution and preparation of the processing.

Furthermore, when verification processing by the verification device is required once again, more complicated processing than the verification processing itself and a great amount of processing time for executing such processing are required with the content of the combination of the related techniques 1 to 4 for setting a test pattern corresponding to the verification processing anew, for input processing of the generated test pattern, for output processing of the processing result, and for the preparation thereof.

Further, since reuse of the verification input/output data (test pattern) is difficult, it becomes necessary to connect a calculator that holds the test pattern to the corresponding verification device and to input the test pattern when verification is to be performed for different circuits in parallel, when verification using a same pattern is to be performed or when verification using a same pattern is performed by an another but same verification device. Thus, it takes a lot of effort and a great number of steps, so that an efficient verification work cannot be done.

It is an object of the present invention to improve the shortcomings of the related techniques and to provide an emulator verification system and an emulator verification method, which make it possible to promptly execute verification processing based on a test pattern in a logic circuit of a device-to-be-verified.

In order to achieve the foregoing object, the present invention includes following structures.

Further, the emulator verification system according to the present invention is characterized as an emulator verification system which includes: a pattern reading/writing device which holds verification test pattern information set in advance and outputs/displays a result of verification processing based on the verification test pattern information; an emulator verification device which performs execution based on the verification test pattern information and verification processing of content of the execution; and a first and a second portable storage media having a connecting part detachable to the pattern reading/writing device and the emulator device, respectively, wherein: the pattern reading/writing device includes a pattern information conversion/writing unit which converts a data format of the verification processing pattern information to a data format to be stored in the first portable storage medium when the first portable storage medium is connected to the pattern reading/writing device and writes out the verification processing pattern information, and a verification result conversion/output unit which acquires verification result information showing the result of the verification processing from the second portable storage medium when the second portable storage medium is connected to the pattern reading/writing device and converts the verification result information to a data format to be outputted/displayed; and the emulator verification device includes a data reading/conversion unit which acquires the verification processing pattern information from the first portable storage medium when the first portable storage medium is connected to the emulator verification device and converts the data format thereof to the data format used for the verification processing, and a verification result conversion/writing unit which converts the data format of the verification processing information to a data format to be used for reading out the data in the second portable storage medium when the second portable storage medium is connected to the emulator verification device and writes out the verification processing pattern information to the second portable storage medium.

Furthermore, the emulator verification method according to the present invention is characterized as an emulator verification method for executing verification processing by an emulator verification system which includes: a pattern reading/writing device which holds verification test pattern information set in advance and outputs/displays a result of verification processing based on the verification test pattern information; an emulator verification device which performs verification processing of content of the execution based on the verification test pattern information; and a first and a second portable storage media having a connecting part detachable to the pattern reading/writing device and the emulator verification device, respectively, and the method includes: converting a data format of the verification processing pattern information to a data format to be stored in the first portable storage medium when the first portable storage medium is connected to the pattern reading/writing device and writing out the verification processing pattern information by using the pattern reading/writing device; acquiring the verification processing pattern information from the first portable storage medium when the first portable storage medium is connected to the emulator verification device and converting the data format thereof to a data format used for the verification processing; converting the data format of the verification processing information to a data format to be used for reading out the data in the second portable storage medium when the second portable storage medium is connected to the emulator verification device and writing out the verification processing pattern information to the second portable storage medium; and acquiring verification result information showing a result of the verification processing from the second portable storage medium when the second portable storage medium is connected to the pattern reading/writing device and converting the verification result information to a data format to be outputted and displayed.

As described above, the present invention is structured to include: the first portable storage medium which inputs the pre-stored verification test pattern when connected to the emulator verification device; and the second portable storage medium which reads out and stores/holds the verification result of the emulator verification device. Therefore, it is possible to provide the emulator verification system and the emulator verification method, which make it possible to promptly execute verification processing based on the test pattern in the logic circuit of the device-to-be-verified.

BEST MODES FOR CARRYING OUT THE INVENTION

First Embodiment

Next, a first embodiment for embodying the present invention will be described by referring to the accompanying drawings.

Figure 1:
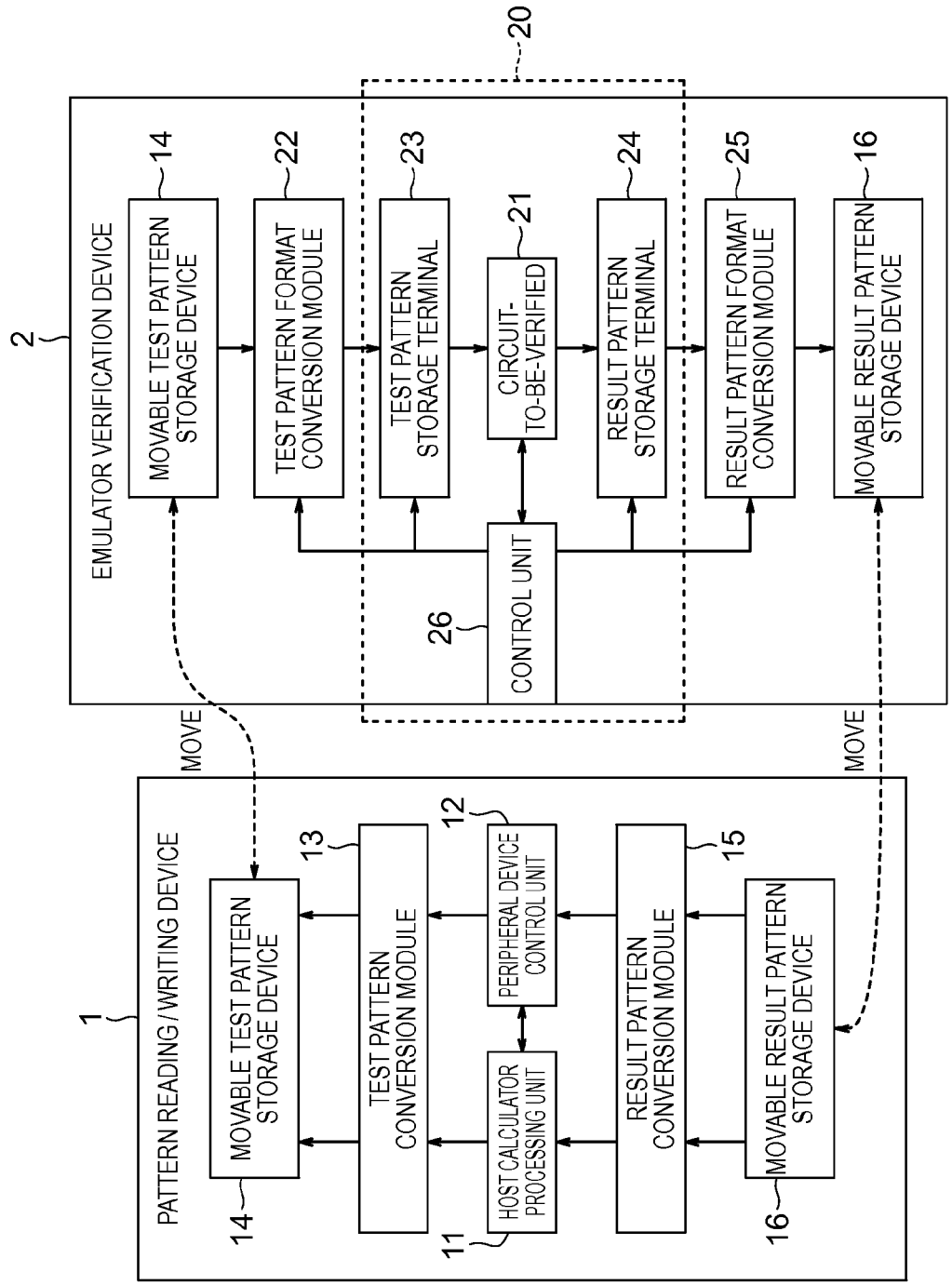
FIG. 1 is a schematic block diagram showing a mode of an emulator verification system according to embodiments of the present invention.

As shown in FIG. 1, an emulator circuit verification system (emulator verification system) according to the first embodiment has the structure which includes: a pattern reading/writing device 1 which holds a test pattern used for verification (verification test pattern); an emulator verification device 2 provided with a circuit to be verified that is an emulation of a verification-target circuit, which performs verification processing based on the verification test pattern by utilizing the circuit to be verified; a movable test pattern storage device 14 as a storage medium that can be connected to the pattern reading/writing device 1 and the emulator verification device 2; and a movable result pattern storage device 16 as a storage medium that can also be connected to the pattern reading/writing device 1 and the emulator verification device 2.

Each of the movable test pattern storage device 14 and the movable result pattern storage device 16 is a nonvolatile storage device (storage medium) to which the stored data is saved even under a state where the power is not being supplied, e.g., a flash memory, a hard disk, or the like.

The pattern reading/writing device 1 includes: a connecting interface (1-1) to which the movable test pattern storage device 14 as the nonvolatile storage device (data storage medium) can be connected; and a connecting interface (1-2) to which the movable result pattern storage device 16 can be connected.

Further, the pattern reading/writing device 1 includes: a host calculation processing unit 11 which generates a test pattern; a peripheral device control unit 12 which acquires the test pattern generated by the host calculation processing unit 11 and transmits it to a test pattern conversion module 13; the test pattern conversion module 13 which converts the data format of the test pattern sent from the peripheral device control unit 12 into a data format to be stored in the movable test pattern storage device 14; and a result pattern conversion module 15 which reads the result pattern from the movable result pattern storage device 16 and converts it to a data form that can be read and written in the host calculation processing unit 11 when the movable result pattern storage device 16 is connected to the connecting interface.

The emulator verification device 2 includes: a connecting interface (2-1) to which the movable test pattern storage device 14 as the nonvolatile storage device (data storage medium) can be connected; and a connecting interface (2-2) to which the movable result pattern storage device 16 as the nonvolatile storage device (data storage medium) can be connected.

Further, the emulator verification device 2 has the structure which includes: a test pattern format conversion module 22 which reads out the test pattern from the movable test pattern storage device 14 and converts the data format of the test pattern to a data format that can be executed by a circuit-unit-to-be-verified 21; a test pattern storage terminal unit 23 which temporarily holds the converted test pattern; the circuit-unit-to-be-verified 21 provided with a circuit to be verified set in advance, which performs verification processing regarding execution processing of the circuit to be verified by performing the execution processing on the circuit to be verified based on the test pattern; a result pattern storage terminal unit 24 which acquires and temporarily holds verification result information that shows the verification result; and a result pattern format conversion module 25 which converts the data format of the result pattern information stored within the result pattern storage terminal unit 24 according to the data format that can be stored in the movable result pattern storage device 16.

Note that the emulator verification device 2 includes inside thereof a control unit 26 as an arithmetic calculation processing unit which controls operation contents of the circuit-unit-to-be-verified 21, the test pattern format conversion module 22, the test pattern storage terminal unit 23, the result pattern storage terminal unit 24, and the result pattern format conversion module 25. Further, a verification processing unit 20 constituted with the control unit 26, the circuit-unit-to-be-verified 21, the test pattern storage terminal unit 23, and the result pattern storage terminal unit 24 is formed.

This will be described in details hereinafter.

Figure 3A:
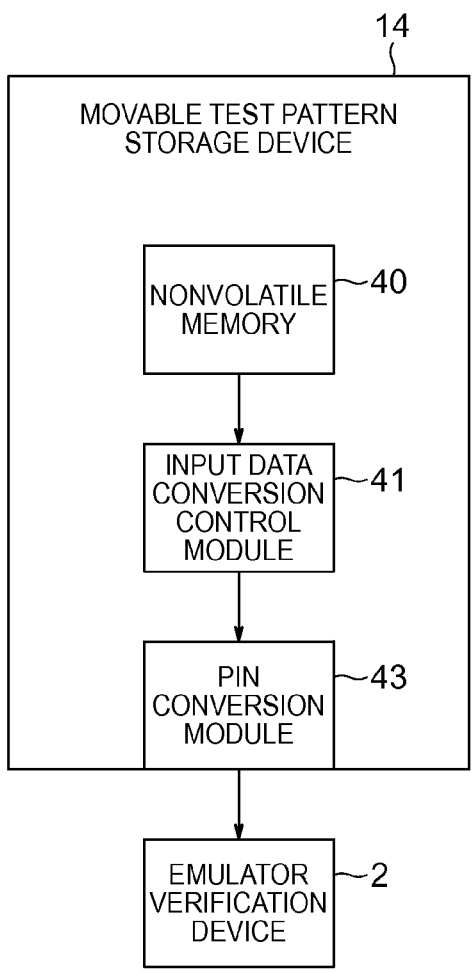
FIG. 3A is a schematic block diagram showing inside structures of a movable test pattern storage device in the emulator verification system shown in FIG. 1.

As shown in FIG. 3A, the movable test pattern storage device 14 has the structure which includes: a pin conversion module 43 as a physical connecting interface for the pattern reading/writing device 1 and the emulator verification device 2; an input data conversion control module 41 which controls reading/writing processing of the test pattern (data) executed via the pin conversion module 43 when connected to the pattern reading/writing device 1 or the emulator verification device 2; and a nonvolatile memory 40 which stores the acquired test pattern information when the pin conversion module 43 is connected to the pattern reading/writing device 1.

Figure 3B:
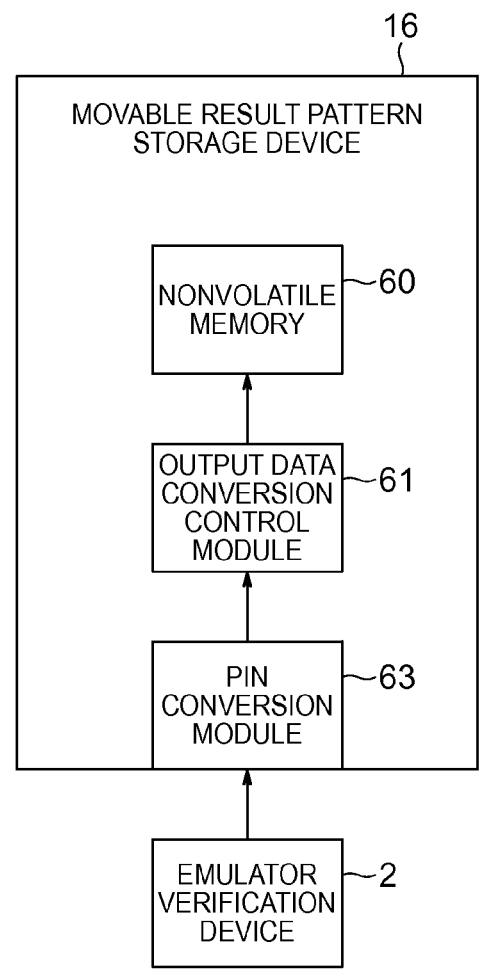
FIG. 3B is a schematic block diagram showing inside structures of a movable result pattern storage device in the emulator verification system shown in FIG. 1.
Figure 4:
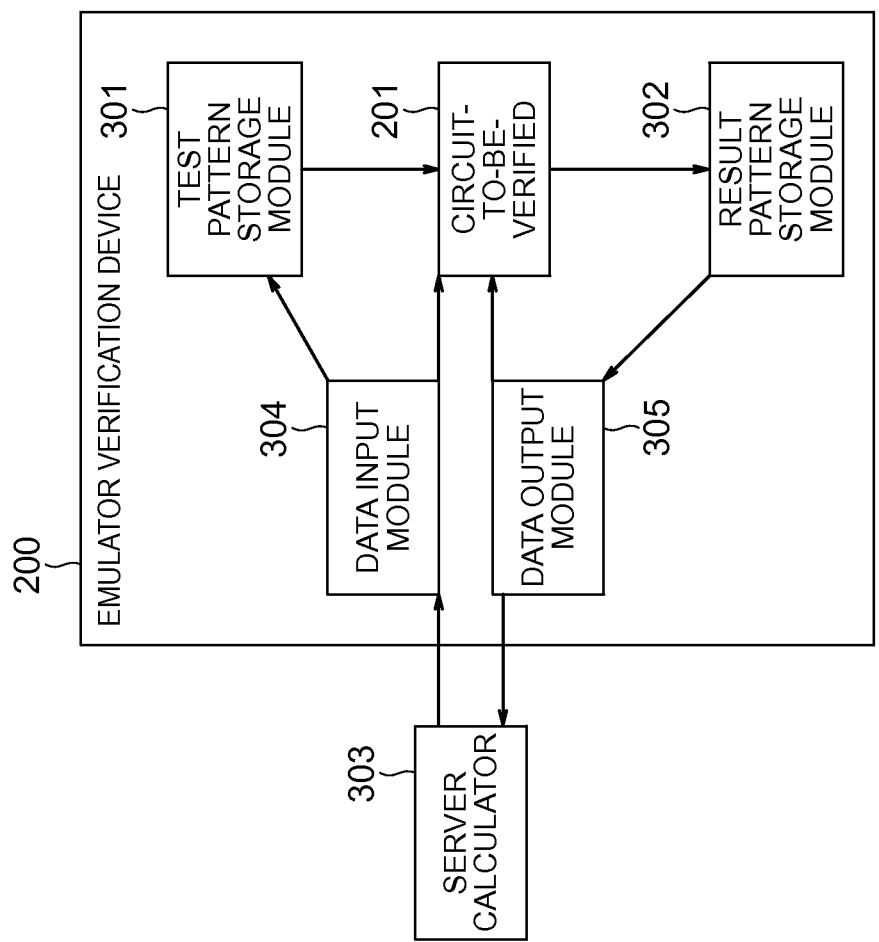
FIG. 4 is a schematic block diagram showing a typical emulator verification system which performs verification processing of an emulator circuit placed physically.

As shown in FIG. 3B, the movable result pattern storage device 16 has the structure which includes: a pin conversion module 63 as a physical connecting interface for the pattern reading/writing device 1 and the emulator verification device 2; an input data conversion control module 61 which controls reading/writing processing of the result pattern information (data) executed via the pin conversion module 63 when connected to the pattern reading/writing device 1 or the emulator verification device 2; and a nonvolatile memory 40 which stores the acquired result pattern information when the pin conversion module 63 is connected to the emulator verification device 2.

Note that each of the nonvolatile memories 40 and 60 is a memory region for storing the test pattern and the result pattern, respectively, and each of those is constituted with a typical nonvolatile memory such as a flash memory or a hard disk memory.

Further, the nonvolatile memory 40 may also be constituted with a multi-purpose calculator flash memory such as an SD card, a CD card, a USB memory, a USB hard disk, or an SSD memory.

Note that the movable test pattern storage device 14 is physically moved and connected to the connecting interface (2-1) of the emulator verification device 2, after storing processing of the test pattern information to the movable test pattern storage device 14 is completed.

With this embodiment, the test pattern used for verification can be inputted to the emulator verification device 2 via the movable test pattern storage device 14 as a mechanism that is independent from the pattern reading/writing device 1 and the emulator verification device 2. Further, it is possible to output the verification result pattern that is the verification result based on the test pattern to the movable result pattern storage device 16 as a mechanism that is independent from the pattern reading/writing device 1 and the emulator verification device 2. Furthermore, it is also possible to take out the verification result pattern as an in-progress result from the emulator verification device 2 even when the verification is still in progress. Note that the verification result taken out while the verification processing is in progress can be loaded to the pattern reading/writing device 1 and outputted/displayed.

The host calculation processing unit 11 of the pattern reading/writing device 1 includes a test pattern generating function which generates a test pattern used for verification in the circuit-unit-to-be-verified 21. The test pattern generated in the host calculation processing unit 11 is sent to the test pattern conversion module 13 via the peripheral device control unit 12. Further, the host calculation processing unit 11 may be structured to have a storage region for holding the verification test pattern set in advance and to have a test pattern input function which inputs the verification test pattern to the test pattern conversion module 13.

The peripheral device control unit 12 includes a function which inputs the test pattern sent from the host calculation processing unit 11 to the test pattern conversion module 13.

Further, the peripheral device control unit 12 includes a result pattern output function which performs a control to output/display the result pattern converted by the result pattern conversion module 15 to a display device and the like set in advance.

The test pattern conversion module 13 performs processing for writing the test pattern stored and held in advance to the movable test pattern storage device 14, when the movable test pattern storage device 14 is connected to the connecting interface (1-1) of the pattern reading/writing device 1 (a test pattern writing function).

Further, the test pattern conversion module 13 includes a data format conversion function which converts the data format of the test pattern to the data format which fits the data format stored in the movable test pattern storage module and can be read and written by the emulator verification device 2 prior to performing execution of the test pattern writing function. Note that the data format that can be read and written by the emulator verification device 2 is registered and set in advance within the pattern reading/writing device 1.

Further, the test pattern conversion module 13 may be set to detect the stored data format in the movable test pattern storage device 14 when the movable test pattern storage device 14 is connected.

This makes it possible for the test pattern conversion module 13 to convert the data format of the test pattern stored in advance to fit the stored data format in the movable test pattern storage device 14.

The movable result pattern storage device 16 reads out the result pattern stored within the result pattern storage terminal unit 24 when the movable result pattern storage device 16 is connected to the connecting interface (2-2) of the emulator verification device 2 (a test pattern readout function). The result pattern conversion module 15 includes a test pattern verification conversion function which converts the data format of the result pattern stored in the movable result pattern storage device 16 to a file which the host calculation processing unit 11 can deal with.

Further, the test pattern format conversion module 15 includes a connection detecting function which detects that the movable result pattern storage device 16 is connected to the connecting interface (1-2) prior to performing execution of the test pattern verification conversion function.

The test pattern format conversion module 22 of the emulator verification device 2 includes: a data format detecting function which detects the data storage format in the movable test pattern storage device 14 when the movable test pattern storage device 14 is connected to the emulator verification device 2; and a test pattern readout function which acquires the test pattern stored within the movable test pattern storage device 14 when the movable test pattern storage device 14 is connected to the connecting interface (2-1).

Further, the test pattern format conversion module 22 includes a verification-device-side verification data format conversion function which converts the data format of the test pattern read out from the movable test pattern storage device 14 to fit the data format that can be processed by the circuit-unit-to-be-verified 21.

This makes it possible for the test pattern conversion module 13 to convert the data format (including information of address and data width) of the test pattern to the data format that can be read/written by the circuit-unit-to-be-verified 21, when the data format of the test pattern stored within the movable result pattern storage device 14 is different from the data format that can be used for verification processing by the circuit-unit-to-be-verified 21.

Further, the test pattern format conversion module 22 inputs the test pattern whose data format is being converted to the test pattern storage terminal unit 23 (a test pattern input function).

The test pattern storage terminal unit 23 includes a data storage region for temporarily storing/holding the test pattern information that is converted by the test pattern format conversion module 22 (a test pattern holding function).

Thereby, the test pattern is stored to the test pattern storage terminal unit 23 in a state that can be accessed from the circuit-unit-to-be-verified 21.

Further, it is possible to restart the verification processing done by the circuit-unit-to-be-verified 21 from the middle thereof by storing the test pattern for restarting the verification in progress to the test pattern storage terminal unit 23 as the test pattern for verification.

The circuit-unit-to-be-verified 21 acquires the test pattern from the test pattern storage terminal unit 23 and inputs it to the circuit-to-be-verified, and performs execution processing on the circuit-to-be-verified based on the test pattern (a test pattern execution processing function). The circuit-unit-to-be-verified 21 outputs the data used for collation with a preset expected value as the result of the execution processing.

Further, the circuit-unit-to-be-verified 21 collates the expected value set in advance for verification with the collation data, and outputs the result of the collation as the verification result (a verification result pattern).

The verification result shows whether or not the circuit-unit-to-be-verified 21 performs the execution processing based on the test pattern in a proper manner when the test pattern is inputted or shows the content of the execution processing.

Thereby, the circuit-unit-to-be-verified 21 outputs the result acquired by making a comparison with the expected value for displaying a waveform chart and performs execution of typical verification processing and verification works such as verification, collation, and a checking work as well as a verification work.

Further, the expected value may be set to be inputted to the circuit-unit-to-be-verified 21 along with the test pattern (or as a part of the test pattern). This makes it possible to set the expected values for collation according to each of the circuits-to-be-verified of the circuits-unit-to-be-verified 21.

Further, the circuit-unit-to-be-verified 21 stores the verification result pattern to the result pattern storage terminal unit 24 (a verification result writing function). At this time, the circuit-unit-to-be-verified 21 stores the verification result pattern to the result pattern storage terminal unit 24 sequentially even when it is in the process of executing the test pattern execution processing function.

Further, the circuit-unit-to-be-verified 21 may be set to extract the data required to be saved and the data required to be referred to among the verification result pattern, to write the data that is to be written to the memory, and to store the data to the result pattern storage terminal unit 24.

Note that the circuit-unit-to-be-verified 21 may also be set to read out of the test pattern, to execute verification, and to write the result pattern continuously based on a test scenario set in advance.

The result pattern storage terminal unit 24 is provided with a data storage region for temporarily storing and holding the result pattern outputted from the circuit-unit-to-be-verified 21 (a result pattern holding function).

The result pattern format conversion module 25 includes a saving data format conversion function which converts the data format of the result pattern read out from the result pattern storage terminal unit 24 to fit the saving data format of the movable result pattern storage device 16.

When the movable result pattern storage device 16 is connected to the connecting interface (2-2) of the device 2, the result pattern format conversion module 25 detects it and performs processing for writing the result pattern whose data format is being converted to the movable result pattern storage device 16 (a result pattern writing function).

Further, the result pattern format conversion module 25 includes a result data format conversion function which converts the data format of the result pattern into the data format which fits the data format stored in the movable result pattern storage device 16 and which can be read/written by the pattern reading/writing device 1, prior to performing execution of the result pattern writing function.

Note that the data format that can be read and written by the pattern reading/writing device 1 is registered and set in advance within the emulator verification device 2.

Note that the result pattern format conversion module 25 may be set to detect the stored data format in the movable result pattern storage device 16, when the movable result pattern storage device 16 is connected.

This makes it possible for the result pattern format conversion module 25 to convert the test pattern stored in advance to fit the stored data format in the movable result pattern storage device 16.

The control unit 26 is constituted with an arithmetic calculation device which operates based on the program, and includes a verification device control function which controls the respective operation functions of the test pattern format conversion module 22, the test pattern storage terminal unit 23, the circuit-unit-to-be-verified 21, the result pattern storage terminal unit 24, and the result pattern format conversion module 25.

(Explanations Regarding Operations of First Embodiment)

Next, overall operations of the first embodiment will be described.

When the movable test pattern storage device 14 is connected to the pattern reading/writing device 1, the test pattern conversion module 13 converts the data format of the verification processing test pattern into the data format stored in the test pattern conversion module 13 and writes it to the movable test pattern storage device 14.

Then, when the movable test patter storage device 14 is connected to the emulator verification device 2, the test pattern format conversion module 22 acquires the test pattern from the movable test pattern storage device 14 and converts the data format to the data format that is used for verification processing.

Here, the circuit-unit-to-be-verified 21 performs verification processing based on the test pattern. When the movable result pattern storage device 16 is connected to the emulator verification device 2, the circuit-unit-to-be-verified 21 converts the data format of the verification processing result to the data format to be saved in the movable result pattern storage device 16 and writes it to the movable result pattern storage device 16.

Then, when the movable result pattern storage device 16 is connected to the pattern reading/writing device 1, the result pattern conversion module 15 acquires the verification processing result (a result pattern) from the movable result pattern storage device 16 and converts to the data format used for output and display.

Figure 2:
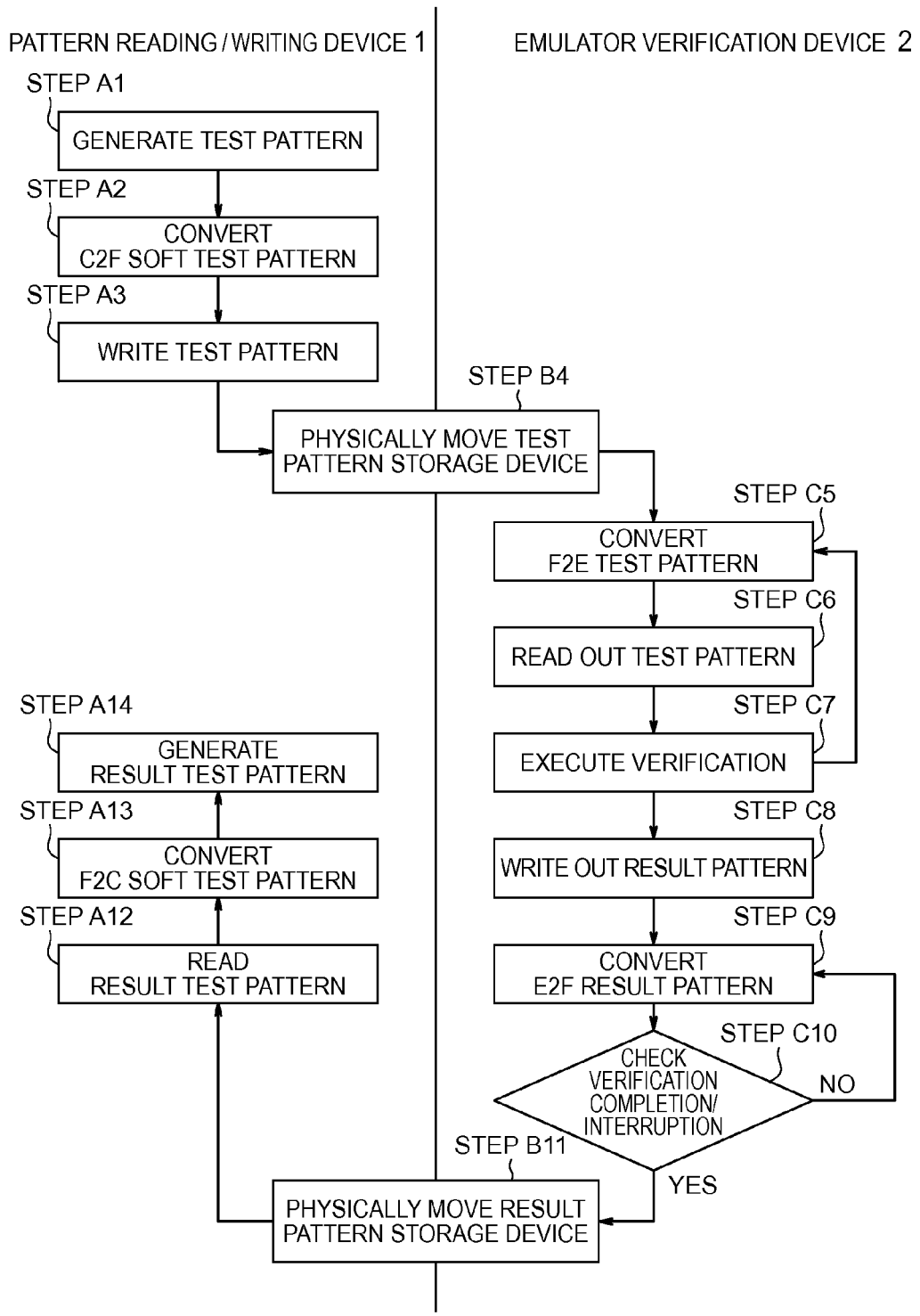
FIG. 2 is a sequence chart showing entire operation contents of the emulator verification system shown in FIG. 1.

Next, the operations of the first embodiment will be described based on a sequence chart of FIG. 2.

First, the host calculation processing unit 11 of the pattern reading/writing device 1 generates a test pattern required for verification processing done by the circuit-to-be-verified (step A1).

Note here that the test pattern is pattern data generated by performing execution processing by the host calculation processing unit 11 based on a program set in advance, which is pattern data containing text data, image data, or moving image data, for example.

Then, the test pattern conversion module 13 acquires the generated test pattern and converts the data format (text data or binary data) of the test pattern into the data format that can loaded to the emulator device 2 and can be loaded (stored) to the movable test pattern storage module 14 (step A2: a test pattern conversion function).

When the test pattern storage device 14 is connected to the pattern reading/writing device 1, the test pattern conversion module 13 performs writing processing of the test pattern whose data format is being converted to the movable test pattern storage device 14 (step A3: a test pattern writing processing function).

Note that execution processing of the test pattern conversion function and the test pattern writing processing function of the test pattern conversion module 13 is controlled by the host calculation processing unit 11.

Then, the movable test pattern storage device 14 is released from the state of being connected to the pattern reading/writing device 1 after writing of the test pattern is completed, and connected (mounted) to the emulator verification device 2 (step B4: move).

Then, when the connection (mount) of the movable test pattern storage device 14 to the emulator verification 2 is detected, the test pattern format conversion module 22 loads the test pattern, and converts the data format of the test pattern from the format saved in the movable test pattern storage module 14 to the data format accessible from the circuit-unit-to-be-verified 21 (step C5: an F2E test pattern conversion step).

This provides a state where it is possible to make an access (refer) to the test pattern data from the test pattern storage terminal unit 23 like a memory, a flip-flop, and a circuit accessible from the circuit-unit-to-be-verified 21.

Then, the test pattern storage terminal unit 23 reads out the test pattern from the test pattern format conversion module 22, and gives it to the circuit-unit-to-be-verified 21 (step C6).

Subsequently, the circuit-unit-to-be-verified 21 performs verification processing based on the test pattern (step C7: execution of verification).

Then, the result pattern storage terminal unit 24 acquires the verification result pattern written by the circuit-unit-to-be-verified 21, and holds it temporarily (step C8).

At this time, the result pattern storage terminal unit 24 may be set to extract the data required to be saved or required to be referred to from the result pattern acquired as the verification result based on the condition set in advance.

Note here that the circuit-unit-to-be-verified 21 may be set to repeatedly execute the steps C6 to 8 described above continuously based on a test scenario that is set in advance as a part of the test pattern.

Then, the result pattern format conversion module 25 converts the result pattern held by the result pattern storage terminal unit 24 to the data format which can be saved in the movable result pattern storage device 16 (step C9).

At this time, the result pattern format conversion module 25 writes the converted result pattern to the movable result pattern storage module 16 while checking whether or not the verification processing is still in progress (step C10).

Here, the result pattern format conversion module 25 judges whether or not the verification state is ended from the acquired result pattern. When it is not judged that the verification processing is ended, i.e., when judged that it is in a state where the verification processing is being interrupted, the result pattern format conversion module 25 acquires the result pattern from the result pattern storage terminal unit 24.

The processing by the result pattern format conversion module 25 is ended when execution of the verification of step 7C is completed or when it matches the prepared interrupting condition. This is judged by the control unit 26 based on a condition program set in advance. When it is in an interrupted state, interruption flag information showing that the verification processing is being interrupted is outputted.

Thereby, the circuit-unit-to-be-verified 21 can promptly restart the processing from an interrupted stage.

Then, when writing to the movable result pattern storage device 16 is completed, the result pattern storage device 16 is connected to the pattern reading/writing device 1 (step B11: move).

When it is detected that the movable result pattern storage device 16 is connected to the pattern reading/writing device 1, the result pattern conversion module 15 reads the result pattern information stored within the movable result pattern storage module 16 (step A12), converts the data format of the result pattern information to the data format that can be processed by the host calculation processing unit 11, and gives it to the peripheral device control unit 12 (step A13: convert result pattern data).

Then, the host calculation processing unit 11 performs processing on the result pattern given to the peripheral device control unit 12 for output, and outputs and displays the verification result (result pattern) of the test pattern via the peripheral device control unit 12 (step A14: generates result test pattern).

While the structure where the nonvolatile memory regions of the movable test pattern storage devices 14, 34 and the nonvolatile memory of the movable result test pattern storage module 16 are separate memories that are different from each other is shown in the first embodiment, those may be constituted as a same memory.

As described above, it is possible with the first embodiment to execute the test pattern and to perform verification without inputting the test pattern to a plurality of different emulator verification devices through copying the content of the nonvolatile memory of the movable test pattern storage device to another nonvolatile memory.

Further, even when the power of the emulator verification device is cut off or when the circuit-to-be-verified of the circuit-unit-to-be-verified 21 is rewritten, the test pattern can be used as it is without resetting the input/output data saving region through utilizing the nonvolatile characteristics of the nonvolatile memory. Through generating a copy of the test pattern storage module itself, it becomes possible to input the same test pattern to a great number of emulator verification devices.

Further, through storing to the result pattern storage module, it is possible to restart the verification processing instantly when the power can be turned on again after the power of the emulator device is set to an off state.

Second Embodiment

Figure 5:
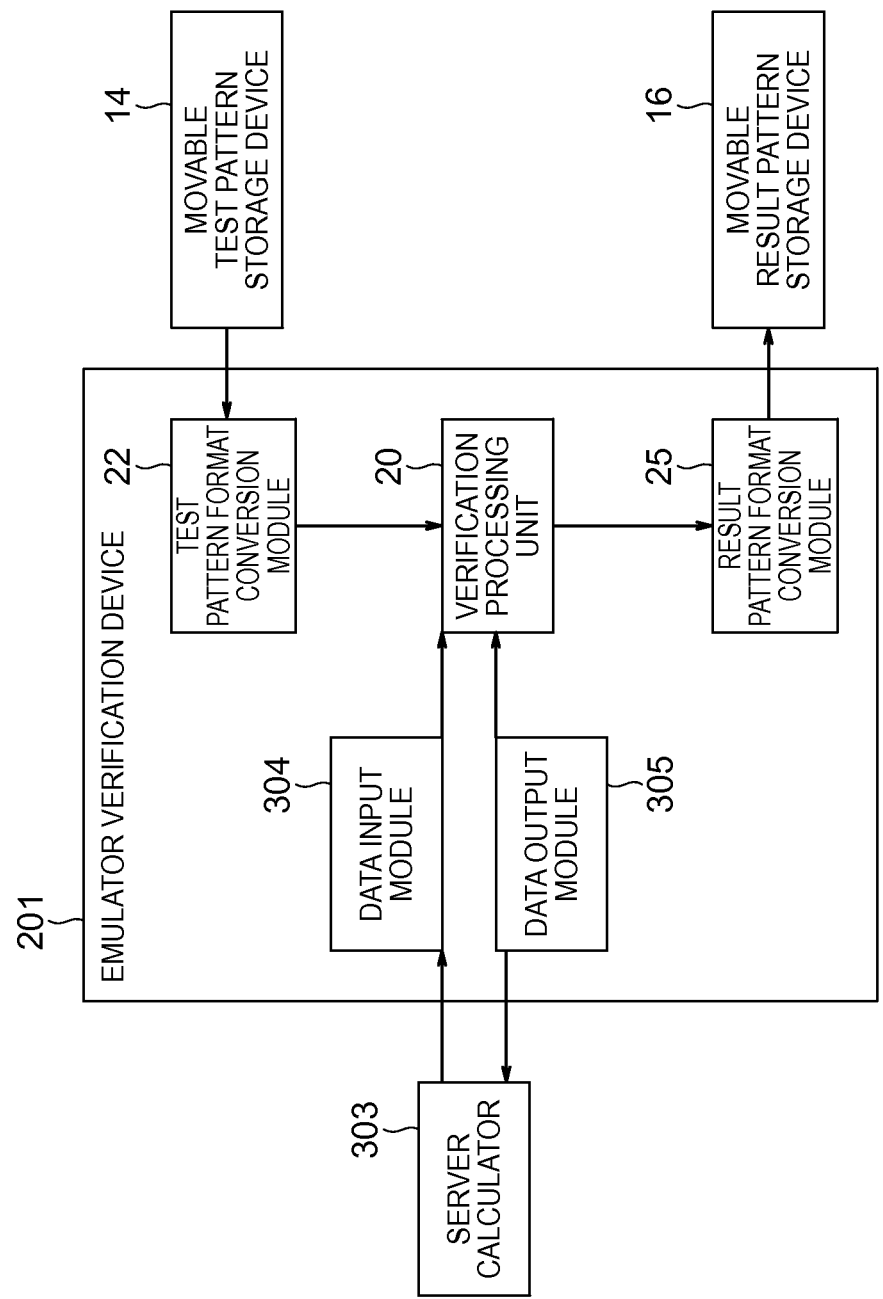
FIG. 5 is a schematic block diagram showing an example of a case where the emulator verification system shown in FIG. 1 is applied to a typical emulator verification system.

Next, an emulator circuit verification system according to a second embodiment will be described by referring to FIG. 5. Note here that same reference numerals are applied to the same components as those of the first embodiment described above.

The emulator circuit verification system according to the second embodiment includes: an emulator verification device 201 provided with a circuit-to-be-verified that is constituted with a rewritable LSI such as FPGA, which performs verification processing based on the execution contents of the circuit-to-be-verified; a server calculator 303 which is placed by being connected to the emulator verification device 201 and inputs the test pattern for verification to the emulator verification device 201; a movable test pattern storage device 14 as a storage medium connectable for inputting the test pattern to the emulator verification device 201; and a movable result pattern storage device 16 as a storage medium for reading out the result pattern by being connected to the emulator verification device 201.

The emulator verification device 201 has the structure which includes: a data input module 304 which receives input of the test pattern from the server calculator 303; a data output module 305 which outputs a part of the verification result pattern generated within the emulator verification device 201 to the server calculator 303; a test pattern format conversion module 22 which reads out the test pattern from the movable test pattern storage device 14 and converts the data format of the test pattern into the data format that can be executed by a circuit-unit-to-be-verified 21; a verification processing unit 20 provided with a circuit to be verified set in advance, which performs verification processing regarding the execution processing of the circuit to be verified by performing the execution processing on the circuit to be verified based on the test pattern; and a result pattern format conversion module 25 which converts the data format of the result pattern information generated by the verification processing unit 20 according to the data format that can be stored in the movable result pattern storage device 16.

The verification processing unit 20 of the emulator verification device 201 includes the circuit-to-be-verified constituted with the rewritable LSI such as FPGA, for example, and acquires a part of the verification data used for the verification processing having the volume equal to or smaller than the volume set in advance from the serve calculator 303. At the same time, the verification processing unit acquires the verification data (including test pattern) used for verification processing having the volume exceeding the volume set in advance from the movable test pattern storage device 14, and performs verification processing regarding the properness of the execution content of the circuit-to-be-verified based on the verification data.

Further, the verification processing unit 20 informs a part of the verification data used for the verification processing having the volume equal to or smaller than the volume set in advance among the result data showing the verification processing result to the server calculator 303 via the data output module 305, and outputs the verification result (including the result pattern) having the volume exceeding the volume set in advance to the movable result pattern storage device 16.

As described above, it is possible with the second embodiment to promptly input the verification test pattern of the volume larger than a specific value set in advance from the movable test pattern storage device 14 and to input the verification data of the volume smaller than the specific value directly to the emulator verification device 201 from the server calculator 303. Therefore, the verification test data including the verification pattern for the verification processing unit 20 can be inputted promptly.

Further, it is possible with the second embodiment to promptly output the verification result pattern of the volume larger than the specific value set in advance to the movable result pattern storage device 16 that is an external medium and to input the verification data of the volume smaller than the specific value directly to the emulator verification device 201 from the server calculator 303. This makes it possible to promptly output the verification result of the verification processing unit 20. Therefore, it becomes possible to output the verification result to the external output device by connecting the movable result pattern storage device 16.

Further, since it is possible to input the expected value as the comparison target of the execution content of the circuit-to-be-verified, the alteration content of the test scenario of the verification processing, and the like to the verification processing unit 20 from the server calculator 303 as the verification data of the volume smaller than the specific value, the verification processing content of the verification processing unit 20 can be set to be altered flexibly.

Third Embodiment

Figure 6:
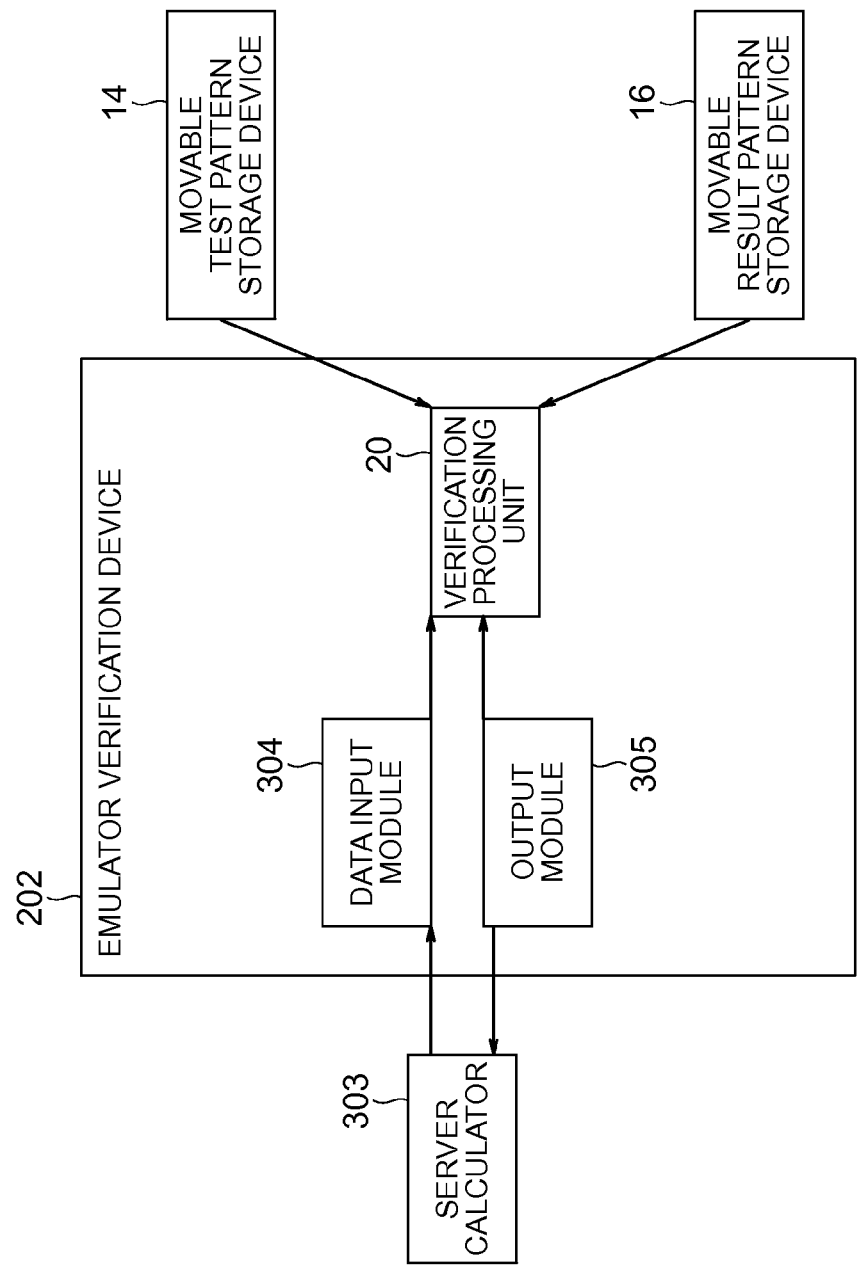
FIG. 6 is a schematic block diagram showing an example of a case where the emulator verification system shown in FIG. 1 is applied to a typical emulator verification system.

Next, an emulator circuit verification system according to a third embodiment will be described by referring to a block diagram shown in FIG. 6. Note here that same reference numerals are applied to the same components as those of the first and second embodiments described above.

The emulator circuit verification system according to the third embodiment has the structure which includes: an emulator verification device 202 provided with a circuit-to-be-verified constituted with a rewritable LSI such as FPGA, which performs verification processing regarding the properness of the circuit based on the execution contents of the circuit-to-be-verified; a server calculator 303 which is placed in a state being directly connected to the emulator verification device 202 and inputs the test pattern for verification to the emulator verification device 201; a movable test pattern storage device 34 as a portable storage medium that can be connected to the emulator verification device 202; and a movable result pattern storage device 36 as a portable storage medium for reading out the result pattern (verification result pattern) showing the verification result by being connected to the emulator verification device 202.

Also, the verification processing unit 20 outputs the generated result pattern to the movable result pattern storage device 16 connected detachably to the emulator verification device 202.

The emulator verification device 202 has the structure which includes: a data input module 304 which receives input of the test pattern from the server calculator 303; a data output module 305 which outputs a part of the verification result pattern generated within the emulator verification device 201 to the server calculator 303; and a verification processing unit 20 provided with a circuit to be verified set in advance, which performs processing to verify the properness regarding the execution processing of the circuit to be verified by performing the execution processing based on the test pattern read out from the movable test pattern storage device 34.

Note that the verification processing unit 20 includes the circuit-to-be-verified constituted with the rewritable LSI such as FPGA, for example, and acquires a part of the verification data used for the verification processing having the volume equal to or smaller than the volume set in advance from the serve calculator 303. At the same time, the verification processing unit 20 acquires the verification data (including test pattern) used for verification having the volume exceeding the volume set in advance from the movable test pattern storage device 34, and performs verification processing regarding the properness of the execution content of the circuit-to-be-verified based on the verification data.

Further, the verification processing unit 20 informs a part of the verification data used for the verification processing having the volume equal to or smaller than the volume set in advance among the result data showing the verification processing result to the server calculator 303 via the data output module 305, and outputs the verification result (including the result pattern) having the volume exceeding the volume set in advance to the movable result pattern storage device 36.

Figure 7:
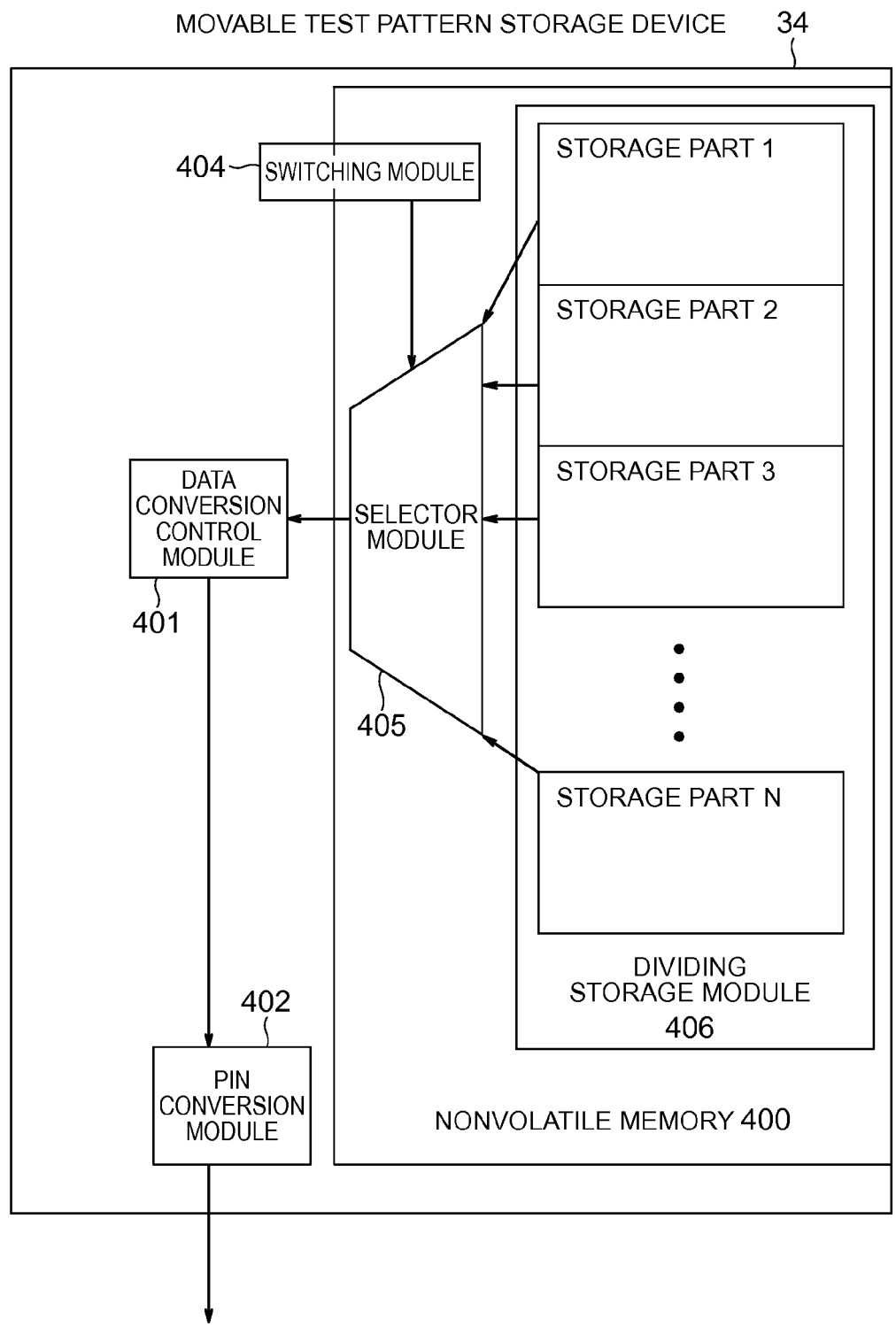
FIG. 7 is a schematic block diagram showing an inside structure of the movable test pattern storage device in the emulation verification system shown in FIG. 1.

As shown in FIG. 7, the movable test pattern storage device 34 has the structure which includes: a nonvolatile memory 400 constituted with different storage regions; a data conversion control module 401 which reads out the test pattern stored in the nonvolatile memory 400 and converts the data format of the test pattern to the data format that can be executed by the verification processing unit 20; and a pin conversion module 402 provided with a connecting interface that can be connected to the emulator verification device 202, which inputs the test pattern whose data format is being converted to the verification processing unit 20 via the connecting interface.

Further, as shown in FIG. 7, the nonvolatile memory unit 400 is a storage region constituted with storage parts 1, 2, 3, - - -, N, which includes: a dividing storage module 406 which divides and stores a large-volume test pattern; a selector module 405 provided by being connected to the data conversion control module 401, which selects the storage part from which the test pattern is read out; and a switching module 404 which designates the selector module 405 to switch the storage part from which the test pattern is read out.

When the switching module 404 designates No. 1, for example, the storage part 1 is set by the selector module 405 as the readout part. Further, when the switching module 404 designates No. 2, the storage part 2 is switched by the selector module 405 to be connected to the data conversion control module 401.

Thereby, it is possible to designate and switch the storage part to be read out by a designation control done by the switching module 404 even when many kinds of test benches are stored in the movable test pattern storage module 401. Therefore, the place of storing the test pattern can be designated and set promptly and accurately depending on different circuits-to-be-verified.

Note that the switching module 404 may be a switch unit that is controlled by a physical switch or software. Further, the nonvolatile memory unit 400 may be set to store the test patterns having the volume exceeding a specific amount.

The data conversion control module 401 includes a test pattern format conversion function which acquires the test pattern read out by the selector module 405 and converts the data format of the test pattern into the data format that can be executed by the verification processing unit 20.

Figure 8:
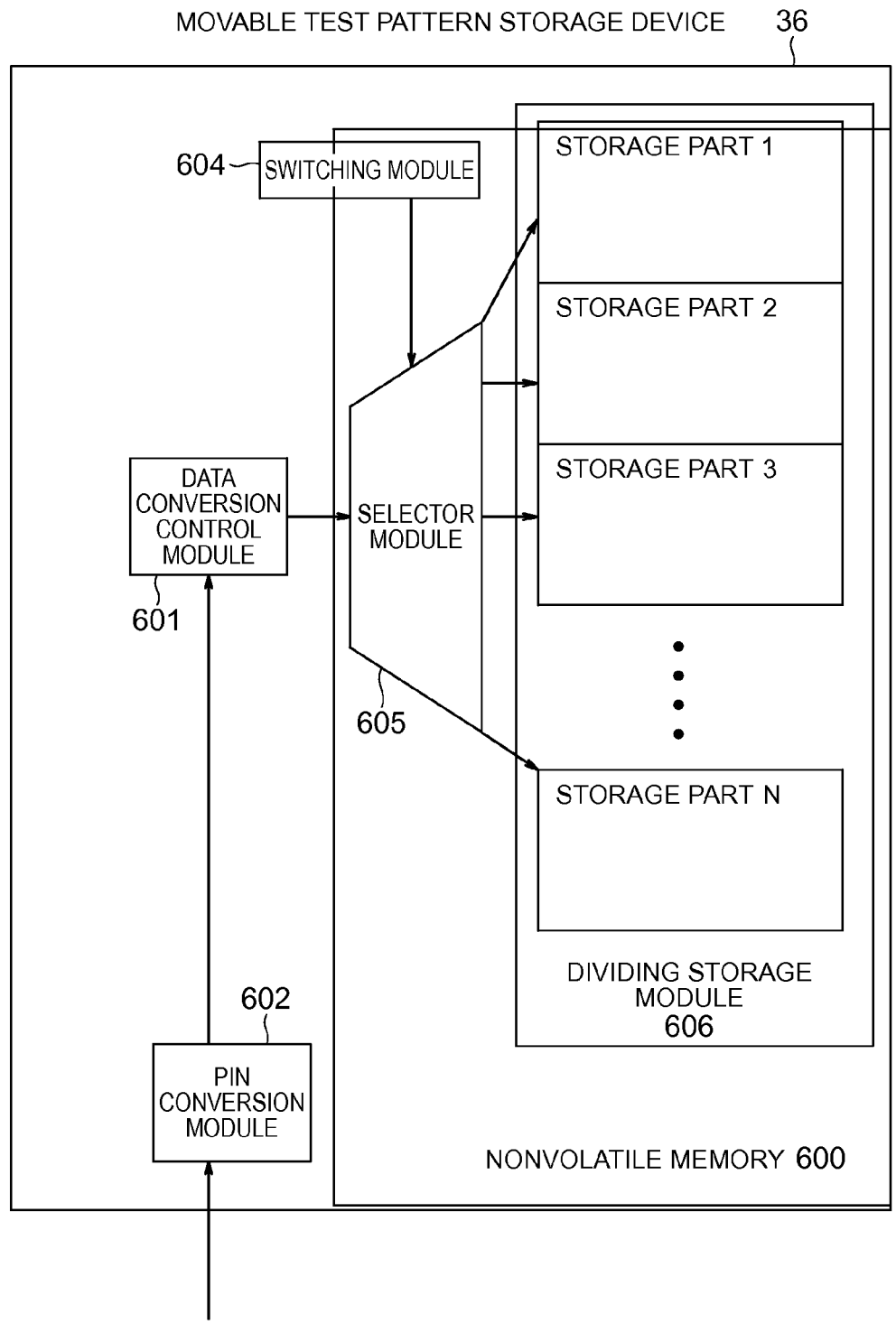
FIG. 8 is a schematic block diagram showing an inside structure of the movable result pattern storage device in the emulation verification system shown in FIG. 1.

As shown in FIG. 8, the movable result pattern storage device 36 has the structure which includes: a nonvolatile memory 600 constituted with different storage regions; a data conversion control module 601 which converts the data format of the result pattern of a size equal to or larger than a specific volume acquired from the emulator verification device 202 into the data format to be stored in the nonvolatile memory 600; and a pin conversion module 602 provided with a connecting interface that can be connected to the emulator verification device 202, which acquires the generated result pattern from the verification processing unit 20 via the connecting interface.

The movable result pattern storage device 36 includes the nonvolatile memory unit 600 which stores the test patterns having the volume larger than a specific amount.

As shown in FIG. 8, the nonvolatile memory unit 600 is a storage region constituted with storage parts 1, 2, 3, - - -, N, which includes a dividing storage module 606 which divides and stores a large-volume test pattern. Further, the nonvolatile memory unit 600 includes a selector module 605 which selects the storage part to which the acquired result pattern is written; and a switching module 604 which designates the selector module 605 to switch the storage part to which the test pattern is written.

When the switching module 604 designates No. 1, for example, the storage part 1 is set by the selector module 605 as the writing part. Further, when the switching module 604 designates No. 2, the storage part 2 is switched by the selector module 605.

This makes it possible to designate and switch the storage part to be written to by a designation control done by the switching module 604, even when many kinds of test benches are stored to the movable result pattern storage device 36 from the emulator verification device 202. Therefore, the result pattern outputted from the emulator verification device 202 can be stored and saved promptly.

Note that the switching module 604 may be a switch unit controlled by a physical switch or software.

The data conversion control module 601 includes a test pattern format conversion function which converts the data format of the result pattern of the verification processing unit 20 acquired via the pin conversion module 602 into the data to be stored in the nonvolatile memory unit 600.

As described above, it is possible with the third embodiment to promptly input the verification test pattern having the volume larger than a specific value set in advance from the movable test pattern storage device 34 and to input the verification data having the volume smaller than the specific value directly to the emulator verification device 201 from the server calculator 303. Therefore, the verification test data including the verification pattern for the verification processing unit 20 can be inputted promptly.

Further, it is possible with the third embodiment to promptly output the verification result pattern having the volume larger than the specific value set in advance to the movable result pattern storage device 36 that is an external medium and to input the verification data having the volume smaller than the specific value directly to the emulator verification device 201 from the server calculator 303. This makes it possible to promptly output the verification result of the verification processing unit 20, and to output the verification result to the external output device by connecting the movable result pattern storage device 36.

Further, since it is possible to input the expected value as the comparison target of the execution content of the circuit-to-be-verified, the alteration content of the test scenario of the verification processing, and the like to the verification processing unit 20 from the server calculator 303 as the verification data having the volume smaller than the specific value, the verification processing content of the verification processing unit 20 can be set to be altered flexibly.

Further, the third embodiment employs the structure which stores the large-scale data such as conversion of sound and moving images to the movable test pattern storage device as the test pattern used for verification and stores the large-scale verification result data to the movable result pattern storage device.

Furthermore, it is structured to input the test data such as control information required in real-time directly to the emulator verification device via the data input module and to inform the verification result information showing abnormality and the like occurred in the verification processing directly to the server calculator. Thereby, the data required instantly for verification can be transmitted and received between the emulator verification device and the server calculator and evaluated without inputting/outputting the data to the movable test pattern storage device and the movable result pattern storage device. Further, it becomes possible to evaluate the large-scale data such as sound and moving images later via the movable test pattern 104 and the movable result pattern 106.

Furthermore, with the first to third embodiments, it is possible to execute and verify the test pattern without inputting the test pattern to a plurality of different emulator verification devices, through copying the content of the nonvolatile memory of the movable test pattern storage device to another nonvolatile memory.

With the use of the nonvolatile characteristics of the nonvolatile memory, it becomes unnecessary to reload the test pattern again even when the power of the emulator verification device is cut off or when the circuit-to-be-verified is rewritten since the pattern stored in the movable test pattern storage device is unchanged. Thus, it is possible to promptly save the result of the verification processing in progress and to restart the verification processing in an interrupted state through the same procedure.

The new technical contents of the above-described embodiments can be summarized as follows. While a part of or a whole part of the embodiments can be summarized as follows as the new techniques, the present invention is not necessarily limited only to the followings.

(Supplementary Note 1)

An emulator verification system, which includes: a pattern reading/writing device which holds verification test pattern information set in advance and outputs/displays a result of verification processing based on the verification test pattern information; an emulator verification device which performs execution based on the verification test pattern information and verification processing of content of the execution; and a first and a second portable storage media having a connecting part detachable to the pattern reading/writing device and the emulator device, respectively, wherein:

the pattern reading/writing device includes a pattern information conversion/writing unit which converts a data format of the verification processing pattern information to a data format to be stored in the first portable storage medium when the first portable storage medium is connected to the pattern reading/writing device and writes out the verification processing pattern information, and a verification result conversion/output unit which acquires verification result information showing the result of the verification processing from the second portable storage medium when the second portable storage medium is connected to the pattern reading/writing device and converts the verification result information to a data format to be outputted/displayed; and the emulator verification device includes a data reading/conversion unit which acquires the verification processing pattern information from the first portable storage medium when the first portable storage medium is connected to the emulator verification device and converts the data format thereof to the data format used for the verification processing, and a verification result conversion/writing unit which converts the data format of the verification processing information to a data format to be used for reading out the data in the second portable storage medium when the second portable storage medium is connected to the emulator verification device and writes out the verification processing pattern information to the second portable storage medium.

(Supplementary Note 2)

The emulator verification system as depicted in Supplementary Note 1, wherein the verification result writing unit includes a verification interruption writing module which interrupts the verification processing and writes out the verification result information to the second portable storage medium when a state of the verification processing matches a verification interruption condition contained in the verification processing pattern information.

(Supplementary Note 3)

The emulator verification system as depicted in Supplementary Note 1, wherein
the emulator verification device includes a single connecting interface unit which can be connected to the connecting parts of the first and second portable storage medium.

(Supplementary Note 4)

The emulator verification system as depicted in Supplementary Note 1, wherein
the emulator verification device includes:
a first and a second connecting interface units corresponding to the connecting units of the first and second portable storage media, respectively; and
a data reading/writing control unit which monitors connecting states of the first and second connecting interface units and controls actions of the data reading/conversion unit and the verification result conversion/writing unit according to the connecting states.

(Supplementary Note 5)

The emulator verification system as depicted in Supplementary Note 4, wherein:
the first portable storage medium includes different storage regions set in advance by corresponding to types of the verification processing pattern information; and
the pattern information conversion/writing unit includes a classified writing function which writes out the verification processing pattern information for each of the types.

(Supplementary Note 6)

An emulator verification system, which includes:
an emulator verification device which verifies properness of an execution content based on verification test information of a circuit-unit-to-be-verified set in advance;
a server device which is connected to the emulator verification device and inputs designation information regarding the verification processing;
a first portable storage medium which is detachably connected to the emulator verification device and inputs verification processing test information that is larger than a data volume set in advance to the emulator verification device; and
a second portable storage medium which is detachably connected to the emulator verification device and acquires and stores/holds verification result information larger than a data volume set in advance showing a result of the verification processing of the emulator verification device, wherein:
the emulator verification device includes a small-volume test information acquiring function which acquires the verification processing test information smaller than a data volume set in advance from the server device, and a small-scale result information output function which outputs verification result information smaller than a data volume set in advance to the server device;
the first portable storage medium includes a verification test data format conversion function which converts a data format of the verification processing pattern information to a data format to be used for the verification processing prior to inputting the verification processing pattern information; and
the second portable storage medium includes a verification result data format conversion function which converts a data format of the verification result information to a data format to be stored and held when acquiring the verification result information.

(Supplementary Note 7)

An emulator verification method for executing verification processing by an emulator verification system which includes: a pattern reading/writing device which holds verification test pattern information set in advance and outputs/displays a result of verification processing based on the verification test pattern information; an emulator verification device which performs verification processing of content of the execution based on the verification test pattern information; and a first and a second portable storage media having a connecting part detachable to the pattern reading/writing device and the emulator verification device, respectively, and the method includes:
converting a data format of the verification processing pattern information to a data format to be stored in the first portable storage medium by the pattern reading/writing device when the first portable storage medium is connected to the pattern reading/writing device and writing out the verification processing pattern information by using the pattern reading/writing device;
acquiring the verification processing pattern information from the first portable storage medium when the first portable storage medium is connected to the emulator verification device and converting the data format thereof to a data format used for the verification processing;
converting the data format of the verification processing information to a data format to be used for reading out the data in the second portable storage medium when the second portable storage medium is connected to the emulator verification device and writing out the verification processing pattern information to the second portable storage medium; and
acquiring verification result information showing a result of the verification processing from the second portable storage medium when the second portable storage medium is connected to the pattern reading/writing device and converting the verification result information to a data format to be outputted and displayed.

This Application claims the Priority right based on Japanese Patent Application No. 2010-158991 filed on Jul. 13, 2010 and the disclosure thereof is hereby incorporated by reference in its entirety.

INDUSTRIAL APPLICABILITY

The present invention can be employed for a parallel verification system which performs execution of a same large-volume test pattern set in advance in each of circuits-to-be-verified set on different verification devices in parallel and outputs the verification result based on the execution result thereof.

REFERENCE NUMERALS

1 Pattern reading/writing device (host calculator)
11 Host calculation processing unit
12 Peripheral device control unit
13 Test pattern conversion module
14, 34 Movable test pattern storage module (first portable storage medium)
15 Result pattern conversion module
16, 36 Movable test pattern storage module (second portable storage medium)
2 Emulator verification device 21 Circuit-unit-to-be-verified
22 Test pattern memory format conversion module
23 Test pattern storage terminal unit
24 Result pattern storage terminal unit
25 Result pattern memory format conversion module

What is claimed is:

1. An emulator verification system, comprising: a pattern reading/writing device which holds verification test pattern information set in advance and outputs/displays a result of verification processing based on the verification test pattern information; an emulator verification device which performs execution based on the verification test pattern information and verification processing of content of the execution; and a first and a second portable storage media having a connecting part detachable to the pattern reading/writing device and the emulator device, respectively, wherein:

the pattern reading/writing device comprises a pattern information conversion/writing unit which converts a data format of the verification processing pattern information to a data format to be stored in the first portable storage medium when the first portable storage medium is connected to the pattern reading/writing device and writes out the verification processing pattern information, and a verification result conversion/output unit which acquires verification result information showing the result of the verification processing from the second portable storage medium when the second portable storage medium is connected to the pattern reading/writing device and converts the verification result information to a data format to be outputted/displayed; and the emulator verification device comprises a data reading/conversion unit which acquires the verification processing pattern information from the first portable storage medium when the first portable storage medium is connected to the emulator verification device and converts the data format thereof to the data format used for the verification processing, and a verification result conversion/writing unit which converts the data format of the verification processing information to a data format to be used for reading out the data in the second portable storage medium when the second portable storage medium is connected to the emulator verification device and writes out the verification processing pattern information to the second portable storage medium.

2. The emulator verification system as claimed in claim 1, wherein the verification result writing unit comprises a verification interruption writing module which interrupts the verification processing and writes out the verification result information to the second portable storage medium when a state of the verification processing matches a verification interruption condition contained in the verification processing pattern information.

3. The emulator verification system as claimed in claim 1, wherein the emulator verification device comprises a single connecting interface unit which can be connected to the connecting parts of the first and second portable storage medium.

4. The emulator verification system as claimed in claim 1, wherein the emulator verification device comprises:

a first and a second connecting interface units corresponding to the connecting units of the first and second portable storage media, respectively; and a data reading/writing control unit which monitors connecting states of the first and second connecting interface units and controls actions of the data reading/conversion unit and the verification result conversion/writing unit according to the connecting states.

5. The emulator verification system as claimed in claim 4, wherein:

the first portable storage medium includes different storage regions set in advance by corresponding to types of the verification processing pattern information; and the pattern information conversion/writing unit includes a classified writing function which writes out the verification processing pattern information for each of the types.

6. The emulator verification system as claimed in claim 1, comprising:

a server device which is connected to the emulator verification device and inputs designation information regarding the verification processing; wherein:

the first portable storage medium is detachably connected to the emulator verification device and inputs verification processing test information that is larger than a data volume set in advance to the emulator verification device;

the second portable storage medium is detachably connected to the emulator verification device and acquires and stores/holds verification result information larger than a data volume set in advance showing a result of the verification processing of the emulator verification device; and the emulator verification device includes a small-volume test information acquiring function which acquires the verification processing test information smaller than a data volume set in advance from the server device, and a small-scale result information output function which outputs verification result information smaller than a data volume set in advance to the server device.

7. An emulator verification method for executing verification processing by an emulator verification system which comprises: a pattern reading/writing device which holds verification test pattern information set in advance and outputs/displays a result of verification processing based on the verification test pattern information; an emulator verification device which performs verification processing of content of the execution based on the verification test pattern information; and a first and a second portable storage media having a connecting part detachable to the pattern reading/writing device and the emulator verification device, respectively, the method comprising:

converting a data format of the verification processing pattern information to a data format to be stored in the first portable storage medium by the pattern reading/writing device when the first portable storage medium is connected to the pattern reading/writing device and writing out the verification processing pattern information by using the pattern reading/writing device;

acquiring the verification processing pattern information from the first portable storage medium when the first portable storage medium is connected to the emulator verification device and converting the fata format thereof to a data format used for the verification processing;

converting the data format of the verification processing information to a data format to be used for reading out the data in the second portable storage medium when the second portable storage medium is connected to the emulator verification device and writing out the verification processing pattern information to the second portable storage medium; and acquiring verification result information showing a result of the verification processing from the second portable storage medium when the second portable storage medium is connected to the pattern reading/writing device and converting the verification result information to a data format to be outputted and displayed.

8. An emulator verification system, comprising: pattern reading/writing means for holding verification test pattern information set in advance and outputting/displaying a result of verification processing based on the verification test pattern information; emulator verification means for performing execution based on the verification test pattern information and verification processing of content of the execution; and a first and a second portable storage media having a connecting part detachable to the pattern reading/writing means and the emulator means, respectively, wherein:

the pattern reading/writing means comprises pattern information conversion/writing means for converting a data format of the verification processing pattern information to a data format to be stored in the first portable storage medium when the first portable storage medium is connected to the pattern reading/writing means and writing out the verification processing pattern information, and verification result conversion/output means for acquiring verification result information showing the result of the verification processing from the second portable storage medium when the second portable storage medium is connected to the pattern reading/writing means and converting the verification result information to a data format to be outputted/displayed; and the emulator verification means comprises data reading/conversion means for acquiring the verification processing pattern information from the first portable storage medium when the first portable storage medium is connected to the emulator verification means and converting the data format thereof to the data format used for the verification processing, and verification result conversion/writing means for converting the data format of the verification processing information to a data format to be used for reading out the data in the second portable storage medium when the second portable storage medium is connected to the emulator verification means and writing out the verification processing pattern information to the second portable storage medium.

* * * * *